(12) United States Patent
Yun

(10) Patent No.: US 7,667,979 B2
(45) Date of Patent: Feb. 23, 2010

(54) PROTECTIVE CIRCUIT BOARD FOR BATTERY PACK

(75) Inventor: Chang Yong Yun, Youngin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 406 days.

(21) Appl. No.: 11/261,393

(22) Filed: Oct. 27, 2005

(65) Prior Publication Data

US 2006/0096778 A1    May 11, 2006

(30) Foreign Application Priority Data

Oct. 28, 2004    (KR)    ........................ 10-2004-0086896

(51) Int. Cl.
*H05K 7/00*    (2006.01)

(52) U.S. Cl. .................. 361/777; 361/760; 361/794; 361/748; 361/767; 361/808; 361/780; 174/262; 174/250

(58) Field of Classification Search .............. 174/244, 174/255, 260–266, 258, 256, 250; 361/760, 361/780, 794, 751, 767, 777, 778, 795, 808, 361/301.4, 790, 792, 748–750, 762
See application file for complete search history.

(56) References Cited

U.S. PATENT DOCUMENTS

| | | | |
|---|---|---|---|
| 6,414,247 B1 * | 7/2002 | Nakai et al. ................. | 174/257 |
| 6,495,772 B2 * | 12/2002 | Anstrom et al. ............. | 174/255 |
| 6,697,259 B1 | 2/2004 | Nakamura | |
| 6,995,322 B2 * | 2/2006 | Chan et al. .................. | 174/262 |
| 2002/0039283 A1 * | 4/2002 | Nakamura et al. .......... | 361/736 |
| 2002/0100613 A1 * | 8/2002 | Anstrom et al. ............. | 174/261 |
| 2003/0196832 A1 * | 10/2003 | Peterson ..................... | 174/255 |
| 2004/0231888 A1 * | 11/2004 | Chan et al. .................. | 174/266 |

FOREIGN PATENT DOCUMENTS

JP    09-064581    3/1997
KR    2001-0034827    4/2001

OTHER PUBLICATIONS

Patent Abstracts of Japan for Publication No. 09-064581; Date of publication of application Mar. 7, 1997, in the name of Kitagawa Toshimasa.
English Abstract for Japan Application 19980147786 dated May 28, 1998, in the name of Nakamura Satoshi.

* cited by examiner

*Primary Examiner*—Dean A. Reichard
*Assistant Examiner*—Hoa C Nguyen
(74) *Attorney, Agent, or Firm*—Christie, Parker & Hale, LLP

(57) ABSTRACT

A protective circuit board for a battery pack for controlling charge and discharge states of the battery pack includes an insulation layer and a first signal pattern disposed inside the insulation layer. The circuit can further include a second signal pattern disposed inside the insulation layer. The circuit can include a first dummy pattern spaced from a first side of the first signal pattern and a second dummy pattern spaced from a second side of the first signal pattern.

17 Claims, 2 Drawing Sheets

PROTECTIVE CIRCUIT BOARD FOR BATTERY PACK

CROSS-REFERENCE TO RELATED APPLICATION

This application claims priority to and the benefit of Korean Patent Application No. 10-2004-0086896, filed with the Korean Intellectual Property Office on Oct. 28, 2004, the entire content of which is incorporated by reference.

BACKGROUND OF THE INVENTION a. Technical Field

The present invention relates to a protective circuit board for a battery pack, and more particularly to a protective circuit board for a battery which minimizes the influence of external electromagnetic waves and static electricity.

b. Description of Related Art

In general, a protective circuit board for a battery pack controls charge and discharge states of the battery pack and interrupts the current of the battery pack when it is overcharged or over-discharged to protect the battery pack and the user.

The structure of a protective circuit board will now be described briefly with reference to FIG. 1.

As shown, a conventional protective circuit board includes an insulation layer 10, at least one conductive first signal pattern 20 formed on a surface of the insulation layer 10 or on the opposite surface, at least one second signal pattern 30 formed on a surface of the insulation layer 10 or on the opposite surface, at least one conductive via 40 for electrically connecting the first and second signal patterns 20 and 30 to each other, and various electronic components 50, such as semiconductor ICs, switches, and/or LEDs, mounted on the first or second signal pattern 20 or 30.

Battery packs having a protective circuit board mounted thereon are frequently exposed to extreme conditions. For example, they are usually used at a place where severe electromagnetic waves occur or are exposed to naturally generated static electricity. Such electromagnetic waves or static electricity generally affect various electronic components on the protective circuit board. Particularly, noise or static electricity may act on the electronic components along first or second signal patterns formed on the surface of the protective circuit board.

The larger the length or area of the first or second signal patterns are, the more likely it is that electromagnetic waves or static electricity will flow towards the electronic components along the first or second signal patterns. As a result, conventional battery packs frequently malfunction as various electronic components fail to operate correctly under the influence of electromagnetic waves or static electricity.

In an attempt to minimize the influence of electromagnetic waves or static electricity, a case, which encloses the protective circuit board, may be subjected to secondary shielding treatment. Alternatively, silicone glue or tape may be attached thereto. However, such measures raise the overall manufacturing cost of battery packs and increase the weight.

SUMMARY OF THE INVENTION

Accordingly, a protective circuit board for a battery pack is provided with main signal patterns disposed inside an insulation layer to minimize the influence of external electromagnetic waves and static electricity.

A protective circuit board for a battery pack for controlling charge and discharge states of the battery pack includes an insulation layer and a first signal pattern disposed inside the insulation layer. In one embodiment, the circuit board further includes a second signal pattern disposed inside the insulation layer.

According to another aspect of the present invention, a protective circuit board includes an insulation layer, first and second dummy patterns disposed inside the insulation layer and spaced a predetermined distance from each other. A signal pattern may be formed between the first and second dummy patterns.

Since main signal patterns are positioned inside the insulation layer, external electromagnetic waves and static electricity are less likely to reach the signal patterns. Therefore, various electronic components mounted on the protective circuit board are not affected by any noise caused by electromagnetic waves and static electricity, and the protective circuit board may be less likely to malfunction.

In addition, the first and second dummy patterns, which are positioned above and below the signal pattern, respectively, absorb and remove electromagnetic waves and static electricity. As a result, the signal pattern, which is positioned between the dummy patterns, is less affected by noise.

A method of minimizing influence of electromagnetic waves and static electricity on signal patterns of a protective circuit board for a battery pack includes providing the protective circuit board with an insulation layer. The insulation layer has a first outer surface, a second outer surface, and a first insulation sublayer and a second insulation sublayer interposed between the first outer surface and the second outer surface. The method also includes disposing a first signal pattern at a first interface between the first insulation sublayer and the second insulation sublayer such that the first signal pattern is spaced from the first outer surface and the second outer surface.

DETAILED DESCRIPTION

Figure 1:
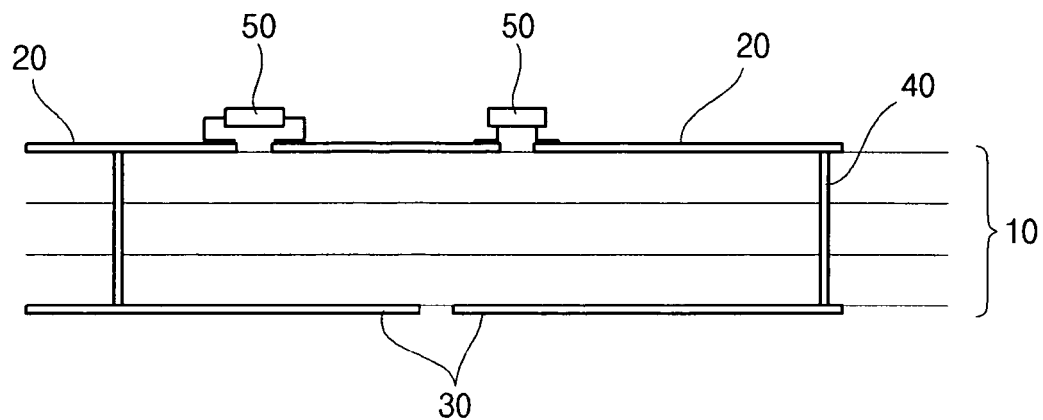
FIG. 1 is a schematic sectional view showing a conventional protective circuit board for a battery pack.

Hereinafter, examples of embodiments of the present invention will be described with reference to the accompanying drawings. In the following description and drawings, the same reference numerals are used to designate the same or similar components, and repetition of the description on the same or similar components will be omitted.

Figure 2:
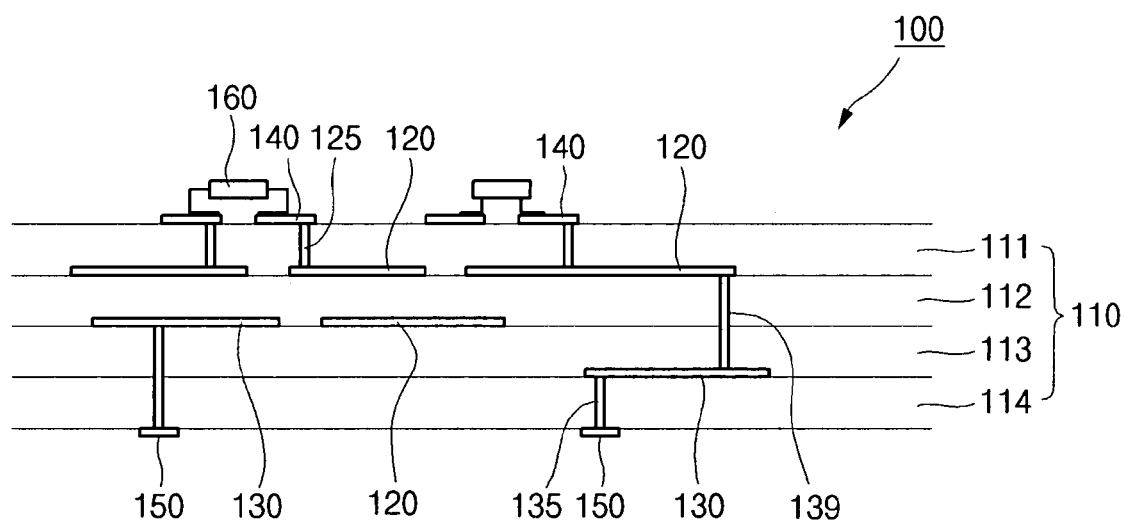
FIG. 2 is a schematic sectional view showing a protective circuit board for a battery pack according to an embodiment of the present invention.

As shown in FIG. 2, a protective circuit board 100 for a battery pack according to one embodiment of the present invention includes at least one insulation layer 110, at least one first signal pattern 120 disposed inside insulation layer 110, at least one second signal pattern 130 disposed inside the insulation layer 110, a first signal pad 140 formed on a surface of the insulation layer 110 while being electrically connected to the first signal pattern 120, and a second signal pad 150 formed on a surface of the insulation layer 110 while being electrically connected to the second signal pattern 130.

The insulation layer 110 in FIG. 2 has first, second, third, and fourth sublayers 111, 112, 113, and 114 successively laminated on top of each other. The number of layers of the insulation layer 110 is not limited to that shown in FIG. 2 and may vary as desired. The insulation layer 110 may be made of an epoxy-based thermosetting resin or an equivalent thereof, but the material is not limited to that herein.

The first signal pattern 120 is disposed inside the insulation layer 110 without being exposed to the exterior thereof. Therefore, electromagnetic waves or static electricity cannot directly affect the first signal pattern 120, although they may affect the surface of the insulation layer 110. This means that the first signal pattern 120 does not generate any noise due to electromagnetic waves or static electricity. Although the first signal pattern 120 is shown in the drawing to be formed on an interface between the first and second layers 111 and 112 of the insulation layer 110, the position is not limited to that in the present invention. For example, the first signal pattern 120 may be formed on an interface between the first and second layers 111 and 112 of the insulation layer 110, on an interface between the second and third sublayers 112 and 113, or on an interface between the third and fourth sublayers 113 and 114. In other words, the position of the first signal pattern 120 is not limited in any manner, as long as it is not exposed to the surface of the insulation layer 110. The first signal pattern 120 may be made of conventional copper or an equivalent thereof, but the material is not limited to that embodiment.

The second signal pattern 130 is disposed inside the insulation layer 110 without being exposed to the exterior thereof, while being spaced a predetermined distance from the first signal pattern 120. As in the case of the first signal pattern 120, therefore, electromagnetic waves or static electricity cannot directly affect the second signal pattern 130, although they may affect the surface of the insulation layer 110. This means that the second signal pattern 130 does not generate any noise due to electromagnetic waves or static electricity.

Although the second signal pattern 130 is shown in the drawing to be formed on an interface between the second and third layers 112 and 113 of the insulation layer 110, the position is not limited thereto. For example, the second signal pattern 130 may be formed on an interface between the first and second layers 111 and 112 of the insulation layer 110, on an interface between the second and third sublayers 112 and 113, or on an interface between the third and fourth sublayers 113 and 114. In other words, the position of the second signal pattern 130 is not limited in any manner, as long as it is not exposed to the surface of the insulation layer 110.

The first and second signal patterns 120 and 130 may be positioned on different planes, the positional relationship is not limited to that shown in the drawing. Particularly, the first and second signal patterns 120 and 130 may be positioned on the same plane. The first and second signal patterns 120 and 130 may be connected to each other by means of a conductive via 139 extending through the insulation layer 110. The conductive via 139 may be made of conventional copper or an equivalent thereof, but the material is not limited to that herein. As will be easily understood by those skilled in the art, various input or output signals can be transmitted via the first or second signal pattern 120 or 130.

The first signal pad 140 occupies a minimum area on the surface of the first sublayer 111 of the insulation layer 110. For example, the first signal pad 140 may have a length corresponding to 0.1-10% of that of the first signal pattern 120. If the length of the first signal pad 140 is smaller than 0.1% of that of the first signal pattern 120, various electronic components 160 must be mounted in a narrow area. This makes the mounting process difficult. If the length of the first signal pad 140 is larger than 10% of that of the first signal pattern 120, electromagnetic waves and static electricity are increasingly likely to affect the first signal pad 140, which has been problematic in the prior art. The first signal pad 140 may be made of conventional copper or an equivalent thereof; but the material is not limited thereto. The first signal pad 140 may be connected to the first signal pattern 120 by means of a conductive via 125. In the drawing, the conductive via 125 extends through the first sublayer 111 of the insulation layer 110 and connects the first signal pad 140 to the first signal pattern 120. The conductive via 125 may be made of conventional copper or an equivalent thereof, but the material is not limited thereto.

The second signal pad 150 occupies a minimum area on the surface of the fourth sublayer 114 of the insulation layer 110. For example, the second signal pad 150 may have a length corresponding to 0.1-10% of that of the second signal pattern 130. If the length of the second signal pad 150 is smaller than 0.1% of that of the second signal pattern 130, various electronic components (not shown in the drawing) must be mounted in a narrow area. This makes the mounting process difficult. If the length of the second signal pad 150 is larger than 10% of that of the second signal pattern 130, electromagnetic waves and static electricity are increasingly likely to affect the second signal pad 150, which has been problematic in the prior art. The second signal pad 150 may be made of conventional copper or an equivalent thereof, but the material is not limited thereto. The second signal pad 150 may be connected to the second signal pattern 130 by means of a conductive via 135. In the drawing, the conductive via 135 extends though the fourth sublayer 114 of the insulation layer 110 and connects the second signal pad 150 to the second signal pattern 130. The conductive via 135 may be made of conventional copper or an equivalent thereof, but the material is not limited thereto.

As the first and second signal patterns 120 and 130 are positioned inside the insulation layer 110, they do not generate either noise or high voltage due to electromagnetic waves or static electricity, which may be transmitted to the surface of the insulation layer 110.

Figure 3:
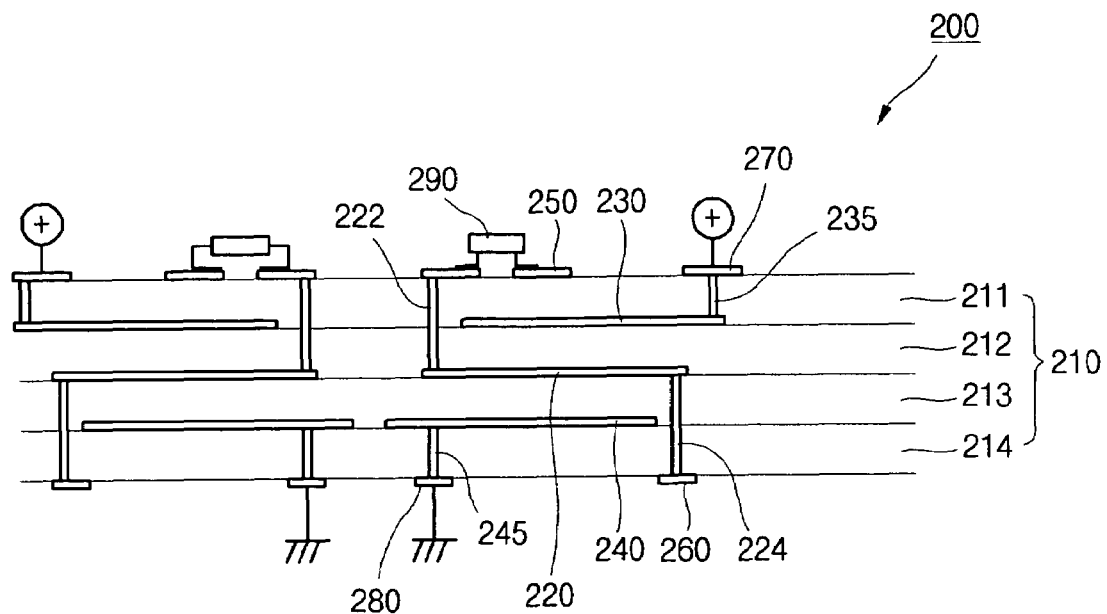
FIG. 3 is a schematic sectional view showing a protective circuit board for a battery pack according to another embodiment of the present invention.

As shown in FIG. 3, a protective circuit board 200 for a battery pack according to another embodiment of the present invention includes at least one insulation layer 210; at least one signal pattern 220 disposed inside the insulation layer 220; first and second dummy patterns 230 and 240 spaced a predetermined distance from the signal pattern 220 in the upward and downward directions, respectively; first and second signal pads 250 and 260 formed on a surface of the insulation layer 210 while being electrically connected to the signal pattern 220; and first and second dummy pads 270 and 280 formed on a surface of the insulation layer 210 while being electrically connected to the first and second dummy patterns 230 and 240, respectively. Descriptions of similar components as in the protective circuit board 100 discussed above in relation to FIG. 2 will be omitted, and differences will now be described.

The insulation layer 210 may be a thermosetting resin including first, second, third, and fourth sublayers 211, 212, 213, and 214 successively laminated, as in the case of the protective circuit board 100 according to the above-mentioned embodiment.

The signal pattern 220 is positioned on an interface between the second and third layers 212 and 213 of the insulation layer 210. The signal pattern 220 may be made of conventional copper or an equivalent thereof, but the material is not limited thereto.

The first and second dummy patterns 230 and 240 are spaced at a predetermined distance from the signal pattern 220 in the upward and downward directions, respectively. For example, the first dummy pattern 230 is positioned on an interface between the first and second sublayers 211 and 212 of the insulation layer 210, and the second dummy pattern 240 is positioned on an interface between the third and fourth sublayers 213 and 214 of the insulation layer 210. The signal pattern 220, which is positioned between the first and second dummy patterns 230 and 240, is located on an interface between the second and third sublayers 212 and 213 of the insulation layer 210. The first and second dummy patterns 230 and 240, in this embodiment, have a length corresponding to 50-150% of that of the signal pattern 220. If the length of the first and second dummy patterns 230 and 240 is smaller than 50% of that of the signal pattern 220, external electromagnetic waves and static electricity are likely to reach the signal pattern 220. If the length of the first or second dummy patterns 230 and 240 is larger than 150% of that of the signal pattern 220, it is difficult to form another pattern and conductive via. The first and second dummy patterns 230 and 240 may be made of conventional copper or an equivalent thereof, but the material is not limited thereto. Even when electromagnetic waves and static electricity reach inside the insulation layer 210, the first and second dummy patterns 230 and 240 absorb and remove it so that the signal pattern 220 positioned between the first and second dummy patterns 230 and 240 is not affected in any manner. As a result, electric components 290, which are electrically connected to the signal pattern 220, are not affected by any noise caused by electromagnetic waves and static electricity.

The first and second signal pads 250 and 260 are positioned on a surface of the insulation layer 210 while being connected to the signal pattern 220. Particularly, the first signal pad 250 is formed on a surface of the first sublayer 211 of the insulation layer 210 and is connected to the signal pattern 220 by means of a conductive via 222. The first signal pad 250 may have an electronic component 290 mounted thereon, such as an active device or a passive device. The second signal pad 260 is formed on a surface of the fourth sublayer 214 of the insulation layer 210 and is connected to the signal pattern 220 by means of a conductive via 224. Although not shown in the drawing, the second signal pad 260 may have an electronic component mounted thereon.

The first and second signal pads 250 and 260, in this embodiment, have a length corresponding to about 0.1-10% of that of the signal pattern 220. If the length of the first and second signal pads 250 and 260 is smaller than 0.1% of that of the signal pattern 220, various electronic components must be mounted in a too narrow area. This makes the mounting process difficult. If the length of the first and second signal pads 250 and 260 is larger than 10% of that of the signal pattern 220, electromagnetic waves and static electricity are increasingly likely to affect the signal pattern 220, which has been problematic in the prior art.

The first and second dummy pads 270 and 280 are positioned on a surface of the insulation layer 210 while being connected to the first and second dummy patterns 230 and 240, respectively. Particularly, the first dummy pad 270 is positioned on a surface of the first sublayer 211 of the insulation layer 210 while being electrically connected to the first dummy pattern 230 by means of a conductive via 235. The second dummy pad 280 is positioned on a surface of the fourth sublayer 214 of the insulation layer 210 while being electrically connected to the second dummy pattern 240 by means of a conductive via 245. A positive or negative (or ground) voltage may be applied to the first dummy pad 270 and a voltage having the opposite polarity to that of the first dummy pad 270 (or ground) may be applied to the second dummy pad 280.

Figure 4:
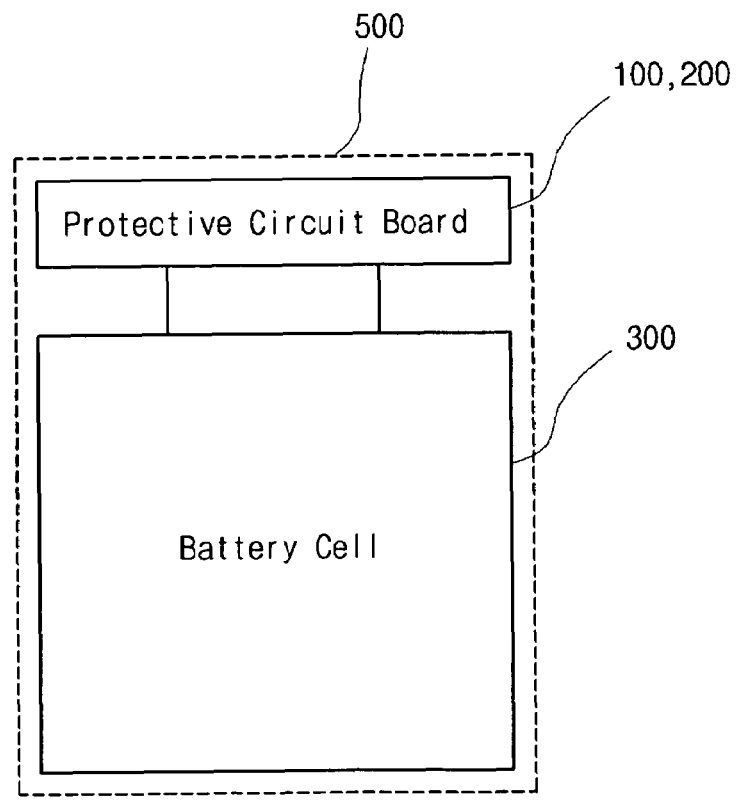
FIG. 4 is a block diagram showing a protective circuit board for a battery pack.

As shown in FIG. 4, a battery pack 500 includes the protective circuit board 100 or 200, and at least one battery cell 300. The protective circuit board 100 or 200 may be electrically coupled to the battery cell 300. Namely, the signal pad of the protective circuit board 100 or 200 may be coupled to terminals of the battery cell 300. The battery cell 300 may be a lithium ion battery, a lithium polymer battery, or an equivalent thereof, but the material is not limited to that herein. Also, the battery cell 300 may be a square-type battery, a cylindrical battery, or an equivalent thereof, according to the appearance, but the appearance is not limited to that herein.

As mentioned above, the protective circuit board for a battery pack according to the this embodiment is advantageous in that, since the first and second signal patterns are positioned inside the insulation layer, external electromagnetic waves and static electricity hardly reach the first and second signal patterns. Therefore, various electronic components mounted on the protective circuit board are not affected by any noise caused by electromagnetic waves and static electricity, and the protective circuit board is prevented form malfunctioning.

In addition, the first and second dummy patterns, which are positioned above and below the signal pattern, respectively, absorb and remove electromagnetic waves and static electricity. As a result, the signal pattern, which is positioned between the dummy patterns, is not affected by any noise.

Although examples of embodiments of the present invention have been described for illustrative purposes, those skilled in the art will appreciate that various modifications, additions and substitutions are possible, without departing from the scope and spirit of the invention as disclosed in the accompanying claims and equivalents thereof.

What is claimed is:

1. A protective circuit board for a battery pack for controlling charge and discharge states of the battery pack, the protective circuit board comprising:
    an insulation layer having a first surface and a second surface;
    a first signal pattern inside the insulation layer, the first signal pattern being coupleable to a terminal of a battery cell through a first signal pad on the first surface of the insulation layer and connected to the first signal pattern;
    a second signal pattern inside the insulation layer and electrically connected to the first signal pattern; and
    a second signal pad on the second surface of the insulation layer and electrically connected to the second signal pattern,
    wherein the first signal pad has an entire length corresponding to 0.1-10% of an entire length of the first signal pattern and is coupleable to the terminal of the battery cell.

2. The protective circuit board as claimed in claim 1, wherein the first signal pattern and the second signal pattern are inside the insulation layer such that they are not exposed to an exterior of the protective circuit board.

3. The protective circuit board as claimed in claim 1, wherein the first signal pattern and the second signal pattern are on a same plane.

4. The protective circuit board as claimed in claim 1, wherein the first signal pattern and the second signal pattern are on different planes.

5. The protective circuit board as claimed in claim 1, wherein at least one of the first signal pattern and the second signal pattern have at least one electronic component electrically connected thereto.

6. The protective circuit board as claimed in claim 1, wherein the first signal pattern and the second signal pattern are connected to each other by a conductive via.

7. The protective circuit board as claimed in claim 1, wherein the first signal pattern is connected to the first signal pad by a conductive via and the second signal pattern is connected to the second signal pad by a conductive via.

8. The protective circuit board as claimed in claim 1, wherein at least one of the first signal pad and the second signal pad have at least one electronic component mounted thereon.

9. The protective circuit board as claimed in claim 1, wherein the insulation layer comprises a first sublayer, a second sublayer, a third sublayer, and a fourth sublayer, the sublayers being successively laminated.

10. The protective circuit board as claimed in claim 9, further comprising:
a first interface between the first sublayer and the second sublayer; and
a second interface between the third sublayer and the fourth sublayer,
wherein the first signal pattern and the second signal pattern are on at least one of the first interface and the second interface.

11. The protective circuit board as claimed in claim 1, wherein the first signal pattern receives transmission of an input signal, an output signal, or both.

12. A protective circuit board for a battery pack for controlling charge and discharge states of the battery pack, the protective circuit board comprising:
an insulation layer;
a signal pattern inside the insulation layer and having a first side and a second side, the signal pattern being coupleable to a terminal of a battery cell through a signal pad on a first surface of the insulation layer and connected to the signal pattern, the signal pad having a length corresponding to 0.1-10% of a length of the signal pattern;
a first dummy pattern spaced from the first side of the signal pattern;
a second dummy pattern spaced from the second side of the signal pattern;
a first dummy pad on the first surface of the insulation layer and electrically connected to the first dummy pattern; and
a second dummy pad on a second surface of the insulation layer and electrically connected to the second dummy pattern.

13. The protective circuit board as claimed in claim 12, wherein a positive voltage is applied to the first dummy pattern, and the second dummy pattern is grounded.

14. The protective circuit board as claimed in claim 12, wherein the first dummy pattern and the second dummy pattern have a length corresponding to 50-150% of a length of the signal pattern.

15. The protective circuit board as claimed in claim 12, wherein the first dummy pattern and the second dummy pattern are respectively connected to the first dummy pad and the second dummy pad through respective conductive vias.

16. A method of minimizing influence of electromagnetic waves and static electricity on signal patterns of a protective circuit board for a battery pack, the method comprising:
providing the protective circuit board with an insulation layer, the insulation layer having a first outer surface, a second outer surface, and a first insulation sublayer and a second insulation sublayer between the first outer surface and the second outer surface;
disposing a first signal pattern of the signal patterns at an interface between the first insulation sublayer and the second insulation sublayer;
disposing a second signal pattern of the signal patterns within the insulation layer between the first outer surface and the second outer surface, and electrically connecting the second signal pattern to the first signal pattern;
forming a first signal pad on the first outer surface of the insulation layer, and connecting the first signal pad to the first signal pattern, the first signal pad having an entire length corresponding to 0.1-10% of an entire length of the first signal pattern;
forming a second signal pad on the second outer surface of the insulation layer, and connecting the second signal pad to the second signal pattern; and
coupling the first signal pad to a terminal of a battery cell.

17. A method of minimizing influence of electromagnetic waves and static electricity on a signal pattern of a protective circuit board for a battery pack, the method comprising:
providing the protective circuit board with an insulation layer;
disposing the signal pattern inside the insulation layer and having a first side and a second side;
spacing a first dummy pattern from the first side of the signal pattern;
spacing a second dummy pattern from the second side of the signal pattern;
forming a signal pad on a first surface of the insulation layer and connecting the signal pad to the signal pattern, the signal pad having a length corresponding to 0.1-10% of a length of the signal pattern;
forming a first dummy pad on the first surface of the insulation layer, and electrically connecting the first dummy pad to the first dummy pattern;
forming a second dummy pad on a second surface of the insulation layer, and electrically connecting the second dummy pad to the second dummy pattern; and
coupling the signal pad to a terminal of a battery cell.

* * * * *